(12) United States Patent
Ikawa et al.

(10) Patent No.: US 10,991,666 B2
(45) Date of Patent: Apr. 27, 2021

(54) LOCATION DISPLACEMENT DETECTION METHOD, LOCATION DISPLACEMENT DETECTION DEVICE, AND DISPLAY DEVICE

(71) Applicant: SHARP KABUSHIKI KAISHA, Sakai (JP)

(72) Inventors: Yuta Ikawa, Sakai (JP); Kenichi Murakoshi, Sakai (JP); Hiroyoshi Higashisaka, Sakai (JP); Shigeyuki Akase, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 220 days.

(21) Appl. No.: 16/216,941

(22) Filed: Dec. 11, 2018

(65) Prior Publication Data

US 2019/0198471 A1 Jun. 27, 2019

(30) Foreign Application Priority Data

Dec. 26, 2017 (JP) .............................. JP2017-250190

(51) Int. Cl.
*H01L 23/00* (2006.01)
*H01L 23/544* (2006.01)
*H01L 29/417* (2006.01)
*H01L 25/075* (2006.01)

(52) U.S. Cl.
CPC ............ *H01L 24/05* (2013.01); *H01L 23/544* (2013.01); *H01L 24/80* (2013.01); *H01L 25/0753* (2013.01); *H01L 29/41716* (2013.01); *H01L 24/16* (2013.01); *H01L 2223/5442* (2013.01); *H01L 2223/54426* (2013.01); *H01L 2224/08145* (2013.01); *H01L 2224/80121* (2013.01); *H01L 2924/00014* (2013.01); *H01L 2924/12041* (2013.01); *H01L 2924/14* (2013.01)

(58) Field of Classification Search
CPC ........ H01L 24/05; H01L 23/544; H01L 24/80
See application file for complete search history.

(56) References Cited

U.S. PATENT DOCUMENTS

2007/0187844 A1* 8/2007 Chen ..................... H01L 24/33
257/789
2008/0089151 A1* 4/2008 Kim ..................... H01L 23/5258
365/200

(Continued)

FOREIGN PATENT DOCUMENTS

JP H10-332789 A 12/1998

*Primary Examiner* — Errol V Fernandes
(74) *Attorney, Agent, or Firm* — ScienBiziP, P.C.

(57) ABSTRACT

A location displacement of an electrode of a device relative to an electrode pad of a semiconductor element is detected based on a conduction state between the electrode pad of the semiconductor element and the electrode of the device. The electrode pad of the semiconductor element is segmented into multiple portions and a first pad through a fourth pad uniformly arranged. A location displacement detector determines that no location displacement has occurred when the electrode pad of the semiconductor element is conductive to the electrode of the device, and determines that a location displacement has occurred when the electrode pad of the semiconductor element is non-conductive to the electrode of the device.

10 Claims, 11 Drawing Sheets

(56) References Cited

U.S. PATENT DOCUMENTS

| | | | |
|---|---|---|---|
| 2009/0021236 A1* | 1/2009 | Foster | G05B 15/02 |
| | | | 324/76.11 |
| 2009/0065772 A1* | 3/2009 | Park | H05K 3/4679 |
| | | | 257/48 |
| 2009/0231569 A1* | 9/2009 | Maeda | G03F 7/70633 |
| | | | 355/77 |

* cited by examiner

LOCATION DISPLACEMENT DETECTION METHOD, LOCATION DISPLACEMENT DETECTION DEVICE, AND DISPLAY DEVICE

BACKGROUND

1. Field

The present disclosure relates to a location displacement detection method, a location displacement detection device, and a display device using the location displacement detection method.

2. Description of the Related Art

A conductive layer is mounted on the surface of a semiconductor element such as a semiconductor integrated circuit element when a mask or a device is bonded onto the semiconductor element. The conductive layer is usually used. as wiring conductors, and part of the conductive layer forms a conductive pattern for connection pads of the semiconductor element that are connected to electrode extension portions of the semiconductor element (electrodes of the semiconductor). When the mask or the device is bonded onto the semiconductor integrated circuit element, a cross or a circle may be used as an alignment mark.

In the alignment method of the related art, a device such as a micro-chip is connected by visually recognizing the alignment mark. In the alignment method of the related art, a location displacement may occur. Particularly, in a micro-chip that is controlled by an infinitesimal current, a resistance value corresponding to the location displacement may possibly largely affect electrical characteristics of the device, and a change in luminance may be caused by the location displacement. The method using the alignment mark is unable to verify an electrical conduction state through visual checking, and it is difficult to control the occurrence of malfunction.

Japanese Unexamined Patent Application Publication No. 10-332789 discusses an electrode substrate alignment method that determines a location displacement from information on, for example, the shapes and size of a pair of electrodes that are to be electrically connected. In such technique, an approximate alignment operation performed first at an initial state is followed by iterated correction and movement operations to achieve infinitesimal alignment. The discussed technique involves time and cost. The number of operations to be iterated renders the technique difficult to use.

It is thus desirable to provide a location displacement detection method and a location displacement detection device that detect simply and accurately a location displacement of an electrical connection portion of a device relative to an electrical connection portion of a semiconductor element that is to be electrically connected to the electrical connection portion of the device, and to provide a reliable display device using the location displacement detection method.

SUMMARY

A location displacement detection method according to an aspect of the disclosure is a location displacement detection method that detects a location displacement of an electrical connection portion of a device relative to an electrical connection portion of a semiconductor element electrically connectable to the electrical connection portion of the device. The location displacement detection method includes detecting the location displacement of the electrical connection portion of the device relative to the electrical connection portion of the semiconductor element, based on a conduction state between the electrical connection portion of the semiconductor element and the electrical connection portion of the device.

The conduction state includes a short circuit state or as open circuit state between the electrical connection portion of the semiconductor element and the electrical connection portion of the device, or a change in the resistance value between the electrical connection portion of the semiconductor element and the electrical connection portion of the device.

A location displacement detection device according to another aspect of the disclosure is a location displacement detection device that detects a location displacement of an electrical connection portion of a device relative to an electrical connection portion of a semiconductor element electrically connectable to the electrical connection portion of the device. The location displacement detection device includes a location displacement detection unit that detects the location displacement of the electrical connection portion of the device relative to the electrical connection portion of the semiconductor element, based on the conduction state between the electrical connection portion of the semiconductor element and the electrical connection portion of the device.

A display device according to another aspect of the disclosure is a display device using the location displacement detection method that detects the location displacement of the electrical connection portion of the device relative to the electrical connection portion of the semiconductor element, based on the conduction state between the electrical connection portion of the semiconductor element and the electrical connection portion of the device. The display device includes the device that is a light-emitting device, and the semiconductor element that is a driving element that drives the light-emitting device.

DESCRIPTION OF THE EMBODIMENTS

Figure 1A:
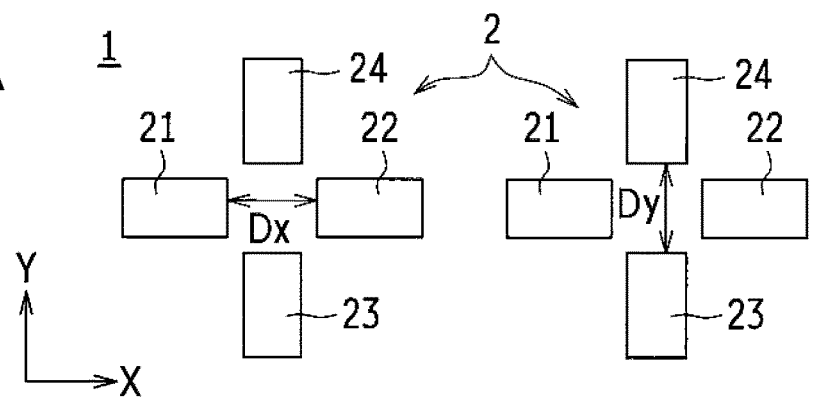
FIGS. 1A through 1D illustrate a location displacement detection method and a location displacement detection device of Embodiment 1.

Location displacement detection methods and location displacement detection devices of embodiments of the disclosure are described below with reference to the drawings.

Embodiment 1

FIGS. 1A through 1D and FIG. 2 illustrate the location displacement detection method and the location displacement detection device of Embodiment 1 of the disclosure.

The location displacement detection method of Embodiment 1 of the disclosure detects a location displacement of an electrical connection portion of a device relative to an electrical connection portion of a semiconductor element electrically connectable to the electrical connection portion of the device. The location displacement detection device performing the location displacement detection method includes a location displacement detection unit 1 that detects the location displacement of the electrical connection portion of the device relative to the electrical connection portion of the semiconductor element, based on a conduction state between the electrical connection portion of the semiconductor element and the electrical connection portion of the device.

FIGS. 1A through 1D illustrate a semiconductor element serving as the location displacement detection device included in an integrated circuit element (not illustrated). The semiconductor element includes electrode pads 2 serving as electrical connection portions that are electrically connected to the integrated circuit element. For example, an electrode 5 serving as an electrical connection portion of a device to be electrically connected to the semiconductor element faces and is connected to the electrode pads 2, and thereby the device is mounted.

The "conduction state" between the electrode pads 2 serving as the electrical connection portion of the semiconductor element and the electrical connection portion of the device includes a short circuit state or an open. circuit state between the electrode pads 2 and the electrodes 5, or a change in a resistance value between the electrode pads 2 and the electrodes 5.

The electrode pads 2 are formed in a variety of layout patterns. In the layout pattern of FIG. 1A, the electrode pads 2 of the semiconductor element include four pads including a first pad 21 through a fourth pad 24. The first pad (first connection portion) 21 and the second pad (second connection portion) 22 are aligned in an X direction (first direction). The third pad (third connection portion) 23 and the fourth pad (fourth connection portion) 24 are aligned in a Y direction (second direction) that is perpendicular to the X direction.

The first pad 21 is apart from the second pad 22 with a first spacing Dx in between in the X direction. The third pad 23 is apart from the fourth pad 24 with a second spacing Dy in between in the Y direction. The first spacing Dx between the first pad 21 and the second pad 22 and the second spacing Dy between the third pad 23 and the fourth pad 24 are common and mutually overlap each other.

Figure 1B:
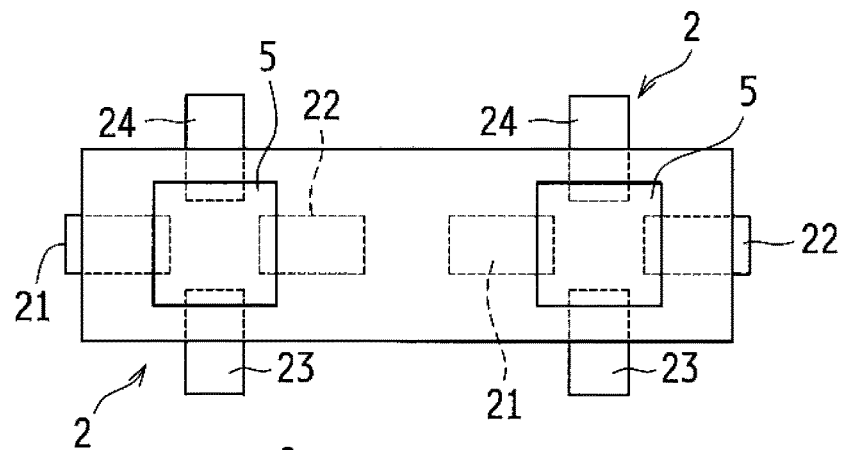
Figure 1C:
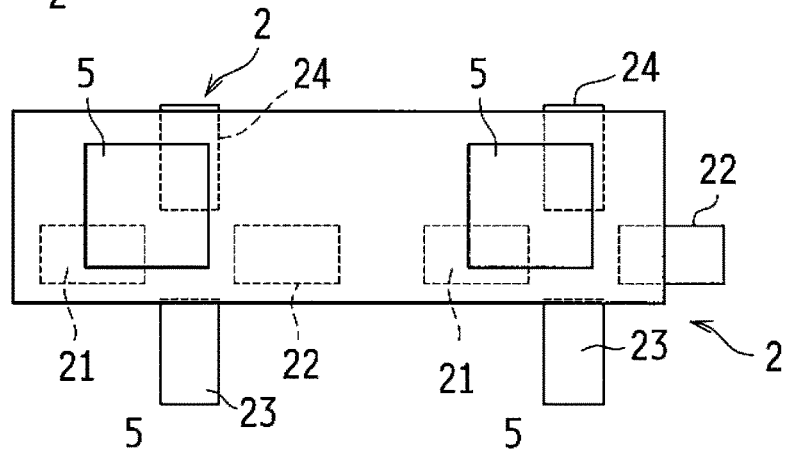

In the illustrated example, a set of electrode pads 2 includes four pads of the first pad 21 through the fourth pad 24, and two sets (connection portion sets) are arranged in the X direction. Referring to FIG. 1B, the device to be connected to the electrode pads 2 of the semiconductor element includes two electrodes 5 corresponding to the two sets of electrode pads 2.

The location displacement detection unit 1 determines whether a location displacement has occurred by referencing the conduction state between the sets of electrode pads 2 and the electrodes 5. If the electrode pads 2 are respectively short-circuited to the electrodes the location displacement detection unit 1 determines that no location displacement has occurred.

More specifically, if the first pad 21 through the fourth pad 24 are all short-circuited (conductive) to the electrodes 5 as illustrated in FIG. 1B, the location displacement detection unit 1 determines that no location displacement has occurred between the electrode pads 2 and the electrodes 5. Each of the electrodes 5 is located at the center of a corresponding one of the two sets of the electrode pads 2 in the X direction and the Y direction, and is in a normally mounted state (normally mounted state).

If the connection between one or more electrode pads 2 and one or more of the electrodes 5 is in an open circuit condition, the location displacement detection unit 1 determines that a location displacement has occurred. In the example illustrated in FIG. 1C, the first pad 21 and the fourth pad 24 are short-circuited to the electrode 5, and the second pad 22 and the third pad 23 are open-circuited (non-conductive) to the electrode 5 in each of the two sets of the electrode pads 2. In this case, the location displacement detection unit 1 determines that a location displacement has occurred, and thus detects the location displacement between the electrode pads 2 and the electrodes 5.

Figure 1D:
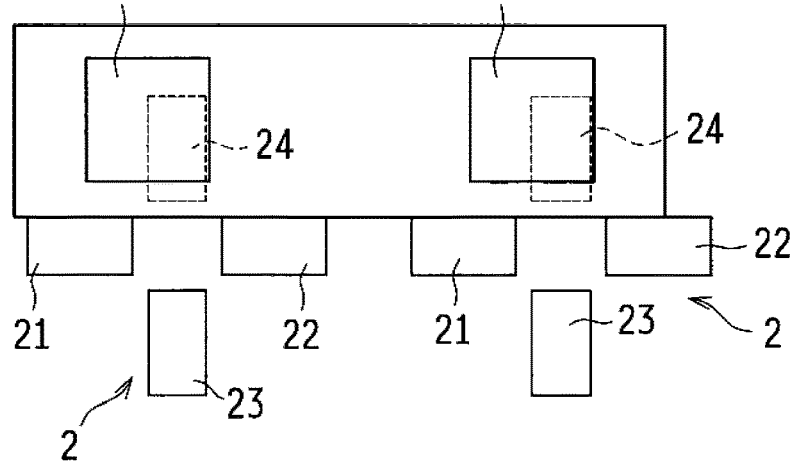

Referring to FIG. 1D, the fourth pad 24 is short-circuited to the electrode 5 and the first pad 21 through the third pad 23 are open-circuited to the electrode 5 in each of the two sets of the electrode pads 2. In this case, as well, the location displacement detection unit 1 determines that a location displacement has occurred. If the number of pads out of the first pad 21 through the fourth pad 24 that are short-circuited to the electrode 5 is small, the location displacement detection unit 1 determines that a large location displacement has occurred, or determines that electrical conduction is not sufficient. Since only the fourth pad 24 is short-circuited, the location displacement detection unit 1 determines that a large location displacement has occurred in the Y direction, and thus detects the location displacement between the electrode pads 2 and the electrodes 5.

In this way, an operator is not requested to perform a position alignment operation that is to be performed by visually checking the set of electrode pads 2 and the electrode 5. The operator is thus able to determine whether a location displacement has occurred, based on the conduction state between the electrode pads 2 and the electrodes 5. In addition, the operator may perform not only the position alignment between the electrode pads 2 and the electrodes 5 but also verify whether the electrode pads 2 and the electrodes 5 are electrically conducted.

Figure 2:
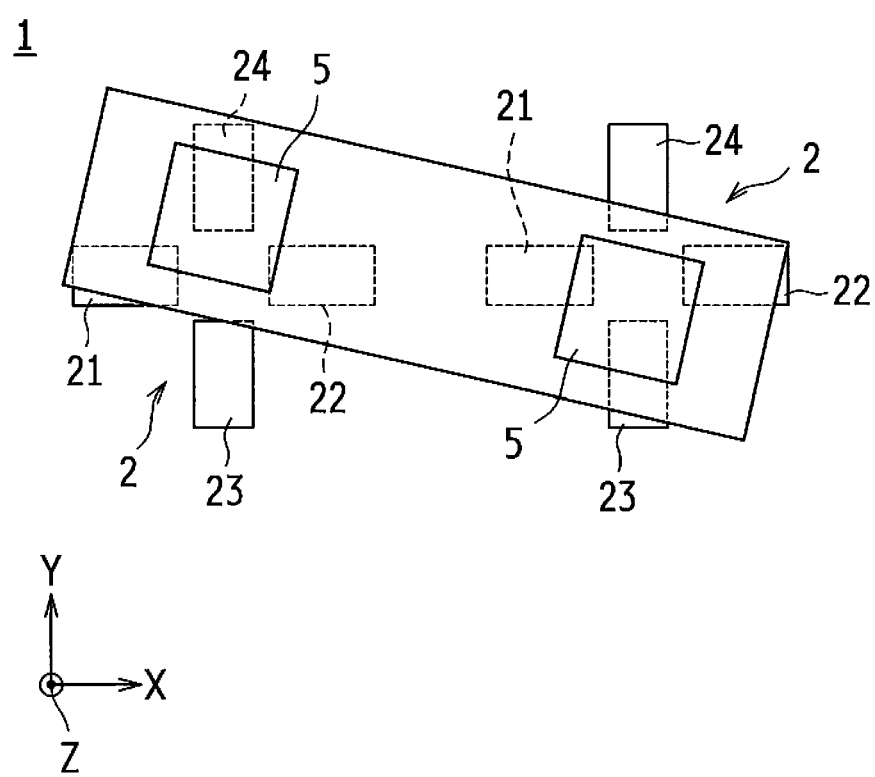
FIG. 2 illustrates another example of the location displacement detection method and the location displacement detection device of Embodiment 1.

Referring to FIG. 2, the location displacement detection unit 1 detects a location displacement in a rotation direction. In this case, the location displacement detection unit 1 detects a location displacement in a rotation direction about an axis in a Z direction (third direction) perpendicular to each of the Y direction and the Y direction.

Referring to FIG. 2, the first pad 21 and the second pad 22 in the X direction and the fourth pad 24 in the Y direction in the set of electrode pads 2 on the left side are short-circuited to the electrode 5, and the third pad 23 is open-circuited to the electrode 5. On the right side of FIG. 2, the fourth pad 24 in the Y direction is open-circuited to the electrode 5, and the third pad 23 in the Y direction and the first pad 21 and the second pad 22 in the X direction are short circuited to the electrode 5. In this conduction state, the location displacement detection unit 1 determines that a location displacement has occurred in the rotation direction, and then detects the location displacement between the electrode pads 2 and the electrodes 5.

The numbers of electrode pads 2 and electrodes 5 are not limited to the two sets of electrode pads 2 and the two electrodes 5, and more electrode pads 2 may be electrically connected to more electrodes 5. When the space between any two adjacent ones of multiple electrodes 5 is expanded, the location displacement in the rotation direction is able to be detected at a higher accuracy. Illustrated is an arrangement in which the first spacing Dx between the first pad 21 and the second pad 22 overlaps the second spacing Dy between the third pad 23 and the fourth pad 24. The disclosure is not limited to this arrangement. The first pad 21 through the fourth pad 24 may be disposed such that the first spacing Dx is different from the second spacing Dy or is shifted from the second spacing Dy. The location displacement may thus be detected more accurately in the X direction and the Y direction.

Embodiment 2

FIG. 3A through FIG. 5B illustrate the location displacement detection method and the location displacement detection device of Embodiment 2.

The location displacement detection methods and the location displacement detection devices of Embodiments 2 to 7 described below have characteristics in terms of the layout pattern of the electrode pads 2. The location displacement detection methods and the location displacement detection devices of Embodiments 2 to 7 are basically common in configuration to those of Embodiment 1, and elements common to those of Embodiment 1 are designated with the same reference numerals and the detailed description thereof is omitted herein.

The location displacement detection method and the location displacement detection device of Embodiment 2 determine whether a location displacement has occurred between the electrode pads 2 and the electrode 5 in consideration of a permissible location displacement range, in other words, determine that no location displacement has occurred if the location displacement falls within the permissible location displacement range. The electrode pads 2 are arranged in a configuration that corresponds to the permissible location displacement range with the electrode 5.

Figure 3A:
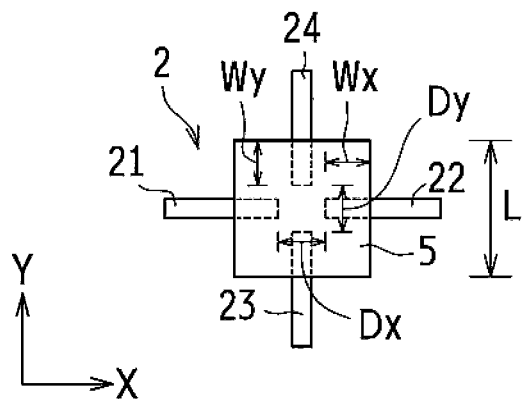
FIGS. 3A through 3D illustrate a location displacement detection method and a location di displacement detection device of Embodiment 2.

Referring to FIG. 3A, the first spacing Dx between the first pad 21 and the second pad 22 is defined with respect to a permissible location displacement range of the electrode pads 2 relative to a square electrode 5 having a side length L. More specifically, when Wx represents the permissible location displacement range in the X direction, the first spacing Dx is expressed as follows:

$$Dx = L - 2Wx + 2\alpha \text{ } (\alpha: \text{ connection margin to establish conduction})$$

In the electrode pads 2, the first spacing Dx is provided between the first pad 21 and the second pad 22. Similarly, when Wy represents the permissible location displacement range in the Y direction, the second spacing Dy between the third pad 23 and the fourth pad 24 may be expressed as follows:

$$Dy = L - 2Wy + 2\alpha \text{ } (\alpha: \text{ connection margin to establish conduction})$$

The second spacing Dy is provided between the third pad 23 and the fourth pad 24. The intermediate point between the first pad 21 and the second pad 22 is aligned with the intermediate point between the third pad 23 and the fourth pad 24.

From these formulas, a length that is calculated by subtracting from the width across the electrode 5 the width across the electrode pad 2 and the connection margin $\alpha$ to establish conduction may be set to be the permissible location displacement range of the electrode pads 2 relative to the electrode 5.

Figure 3B:
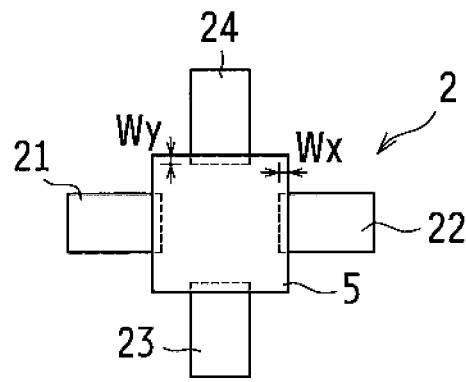
Figure 3C:
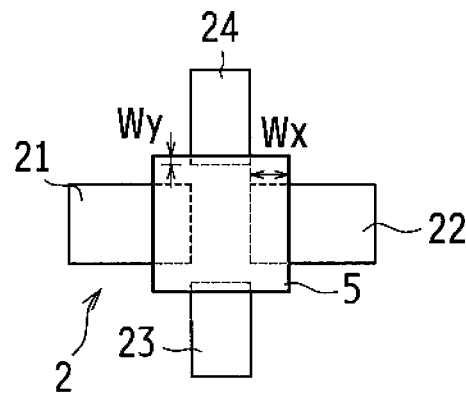

In the example of FIG. 3B, the permissible location displacement ranges Wx and Wy are set to be small (by accounting for a connection margin $\alpha$ or by accounting for the connection margin $\alpha$ with a tolerance $\beta$ added. thereto). The layout pattern enables accurate position alignment. In the example of FIG. 3C, the permissible location displacement range Wx in the X direction and the permissible location displacement range Wy in the Y direction are set to be different. The layout pattern enables more accurate position alignment in the Y direction than in the X direction.

Figure 3D:
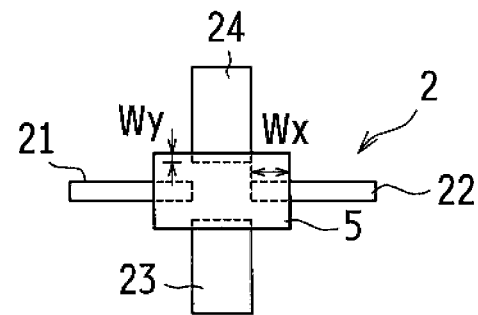

In the example of FIG. 3D as in the example of FIG. 3C, the permissible location displacement range Wx in the X direction and the permissible location displacement range Wy in the Y direction are set to be different from each other such that position alignment is more accurate in the Y direction than in the X direction. The electrode 5 has a rectangular shape. The location displacement may thus be detected by referring to the degree of position alignment between the electrode pads 2 and the electrode 5 in a variety of layout patterns of the electrode pads 2 described above.

Figure 4A:
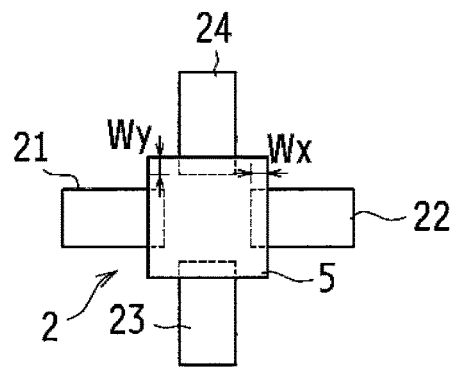
FIGS. 4A and 4B illustrate another example of the location displacement detection method and the location displacement detection device of Embodiment 2.
Figure 4B:
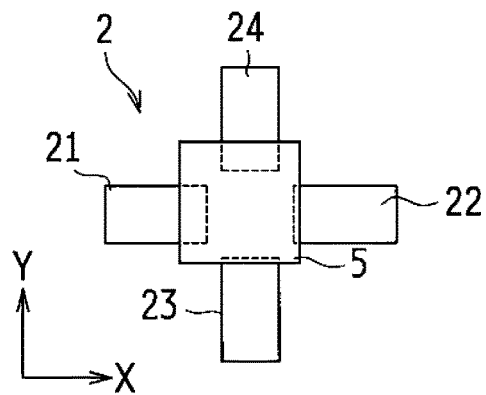

FIGS. 4A and 4B illustrate examples of connection configuration between the electrode pads and the electrode 5. The electrode pads 2 are disposed, based on the permissible location displacement range Wx in the X direction and the permissible location displacement range Wy in the Y direction. Referring to FIG. 4A, the electrode 5 is disposed in almost uniform overlapping areas on and is thus short-circuited to the first pad 21 through the fourth pad 24 in the set of electrode pads 2. The normally mounted state is thus achieved with no location displacement. In this case, electrical conduction between the electrode pads 2 and the electrode 5 is verified.

In contrast, the electrode 5 is shifted more in position in the X direction and the Y direction in FIG. 4B than in FIG. 4A, but all the first pad 21 through the fourth pad 24 are short-circuited to the electrode 5. In this case, the connection is established within the permissible location displacement ranges, and the location displacement detection unit 1 may determine that no location displacement has occurred.

Figure 5A:
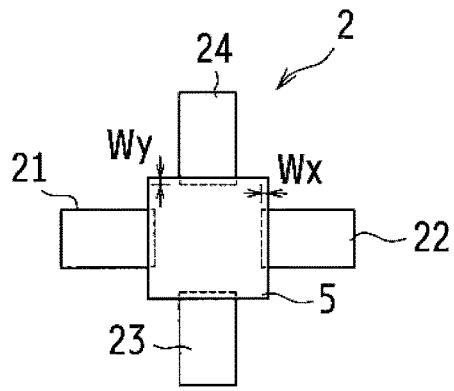
FIGS. 5A and 5B illustrate another example of the location displacement detection method and the location displacement detection device of Embodiment 2.
Figure 5B:
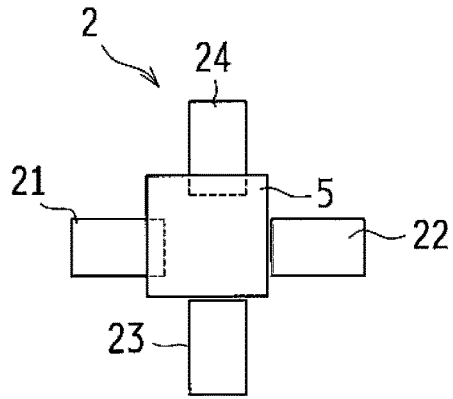

FIGS. 5A and 5B illustrate the connection configuration of the set of electrode pads 2 and the electrode 5 in which the permissible location displacement range Wx in the X direction and the permissible location displacement range Wy in the Y direction are set to be small. Referring to FIG. 5A, the electrode 5 is disposed in almost uniform overlapping areas on and is thus short-circuited to the first pad 21 through the fourth pad 24 in the set of electrode pads 2. The normally mounted state is thus achieved with no location displacement. In this case, the electrical conduction between the electrode pads 2 and the electrode 5 is verified.

In contrast, the electrode 5 is shifted more in position in the X direction and the Y direction in FIG. 5B than in FIG. 5A. The first pad 21 and the fourth pad 24 are short-circuited to the electrode 5 and the second pad 22 and the third pad 23 are open-circuited to the electrode 5. In this case, the location displacement detection unit 1 determines that a location displacement has occurred, and thus detects the location displacement between the electrode pads 2 and the electrode 5.

The set of electrode pads 2 of the semiconductor element including the first pad 21 through the fourth pad 24 has been described. The number of sets of electrode pads 2 may not be limited to one but may be more as described with reference to Embodiment 1. The same is true of Embodiment 3 and Embodiment 4.

Embodiment 3

FIGS. 6A and 6B and FIGS. 7A and 7B illustrate the location displacement detection methods and the location displacement detection devices of Embodiment 3.

Figure 6A:
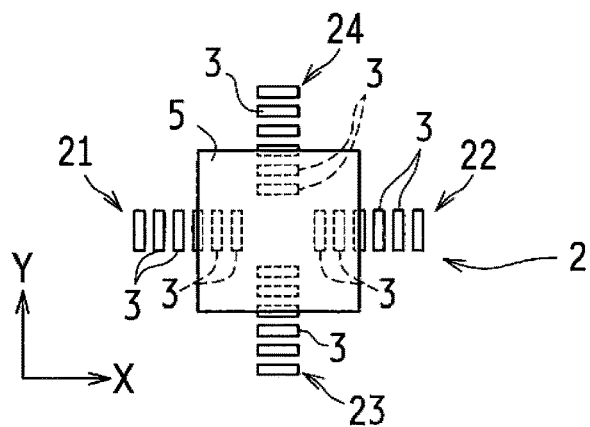
FIGS. 6A and 6B illustrate a location displacement detection method and a location displacement detection device of Embodiment 3.

In the location displacement detection methods and the location displacement detection devices of Embodiment 3, each of the first pad 21 through the fourth pad 24 in the set of electrode pads 2 is divided into multiple sub-portions. Referring to FIG. 6A, each of the first pad 21 and the second pad 22 disposed in the X direction is divided into multiple scale pad segments (scale connection portion segments) 3. The scale pad segments 3 are disposed in the X direction with equal intervals therebetween. Similarly, each of the third pad 23 and the fourth pad 24 disposed in the Y direction is divided into multiple scale pad segments (scale connection portion segments) 3. The scale pad segments 3 are disposed in the Y direction with equal intervals therebetween.

In the example of FIG. 6A, the electrode 5 is disposed on the first pad 21 through the fourth pad 24 such that the same number of scale pad segments 3 in each pad are short-circuited to the electrode 5. In this way, no location displacement occurs in the electrode 5 relative to the electrode pads 2, the electrical conduction is verified, and the normally mounted state is thus confirmed.

Figure 6B:
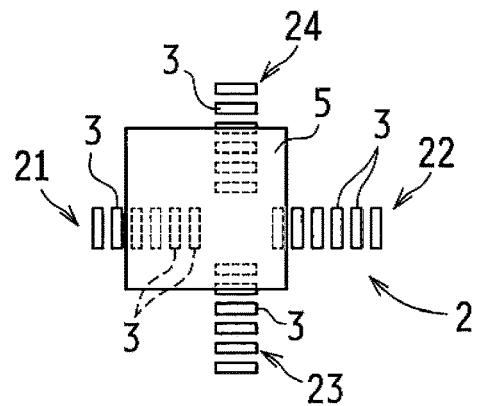

A positional relationship of the electrode 5 relative to the scale pad segments 3 may be visually checked in the electrode pads 2 to determine whether a location displacement has occurred. In contrast to the normally mounted state of FIG. 6A, the way how the scale pad segments 3 in the first pad 21 look is different the way how the scale pad segments 3 in the second pad 22 look as illustrated in FIG. 6B. In this way, the visual check reveals that the electrode 5 is shifted in the X direction (leftward in FIG. 6B). The way how the scale pad segments 3 in the third pad 23 look is different from the way how the scale pad segments 3 in the fourth pad 24 look. The visual check also reveals that the electrode 5 is shifted in the Y direction (upward in FIG. 6B).

Figure 7A:
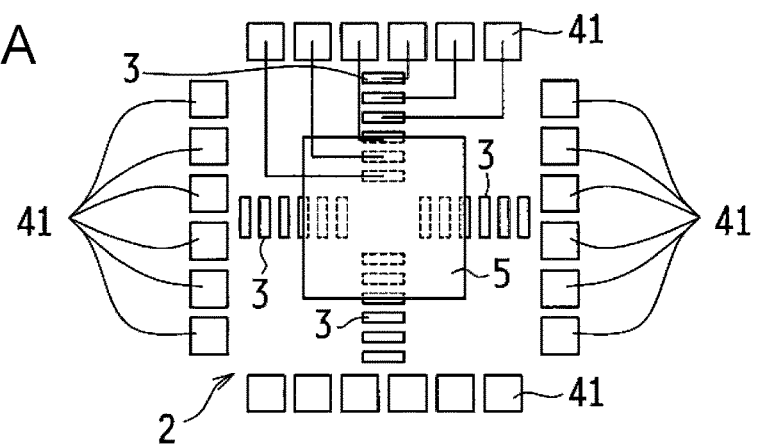
FIGS. 7A and 7B illustrate another example of the location displacement detection method and the location displacement detection device of Embodiment 3.
Figure 7B:
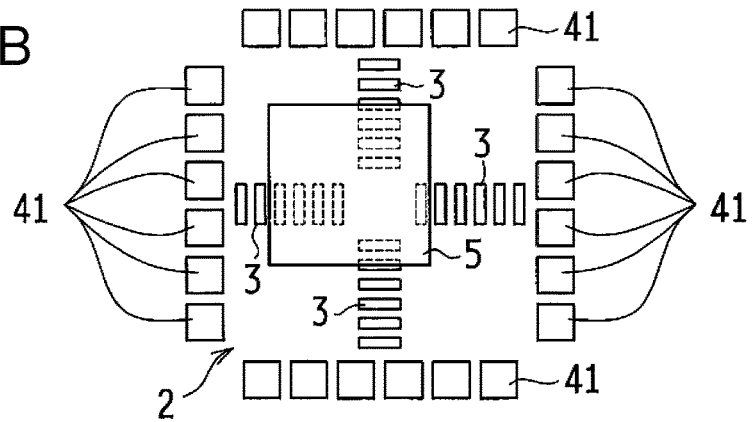

The scale pad segments 3 included in each of the first pad 21 through the fourth pad 24 are desirably electrically connected to detection pads 41, respectively. Since the scale pad segments 3 are respectively connected to the detection pads 41 as illustrated in FIG. 7A, up to what scale pad segment 3 is short-circuited is detected. As illustrated in FIGS. 7A and 7B, the connection lines between the detection pads 41 and the scale pad segments 3 are partly omitted.

In the example of FIG. 7A, the short circuit of up to the third scale pad segment 3 in each of the first pad 21 through the fourth pad 24 to the electrode 5 is detected, and the location displacement detection unit 1 determines that no location displacement has occurred. In the example of FIG. 7B, the first pad 21 is different from the second pad 22 in the number of scale pad segments 3 that are short-circuited, and the location displacement detection unit 1 determines that the electrode 5 is shifted in the X direction. The third pad 23 is different from the fourth pad 24 in the number of scale pad segments 3 that are short-circuited, and the location displacement detection unit 1 determines that the electrode 5 is shifted in the Y direction. Since detection pads 41 are used to detect up to what scale pad segment 3 is short-circuited, the presence/absence of a location displacement as well as the amount of the location displacement is determined.

Not only the presence/absence of the location displacement of the electrode 5 relative to the electrode pads 2 is detected via the visual check, but also the amount of the location displacement in the X direction is easily detected by referring to the conduction state between each of the first pad 21 and the second pad 22 that are divided into multiple segments. This method may be particularly useful in infinitesimal position alignment that is difficult to perform through visual checking. Also, the amount of the location displacement in the Y direction is easily detected by referring to the conduction state between each of the third pad 23 and the fourth pad 24 that are divided into multiple segments.

Embodiment 4

Figure 8:
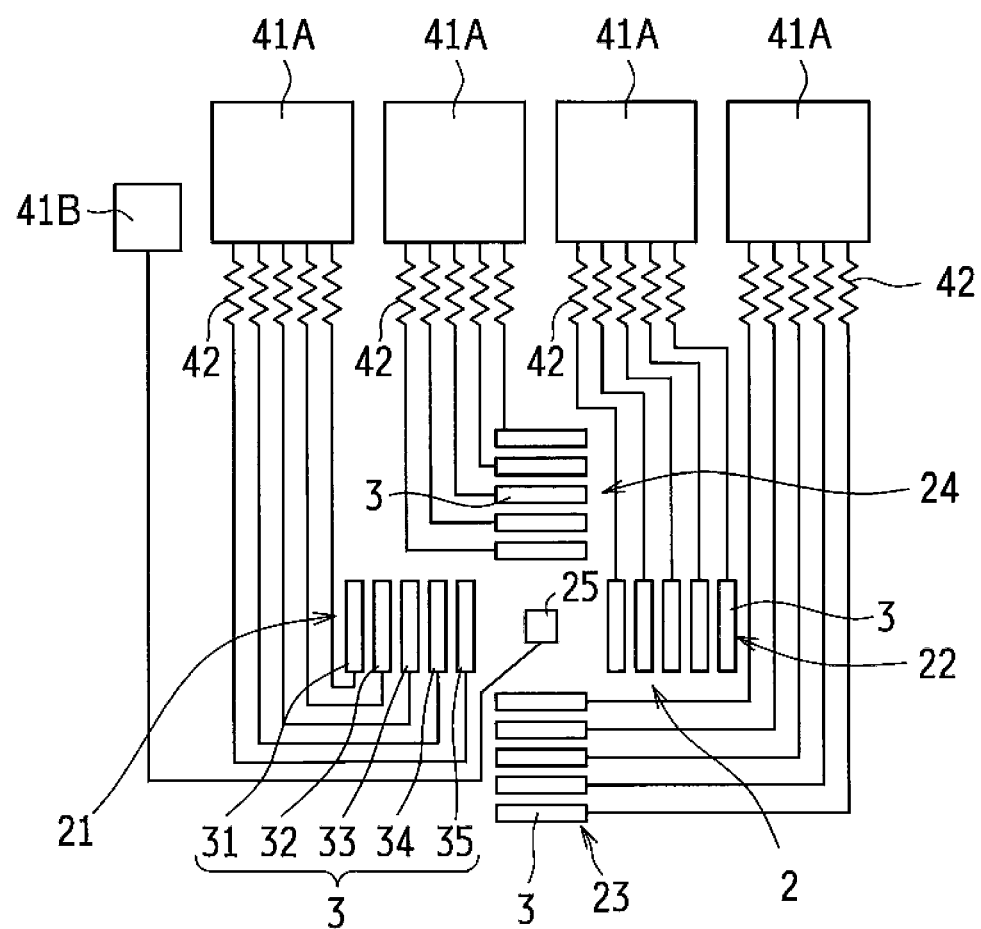
FIG. 8 illustrates a location displacement detection method and a location displacement detection device of Embodiment 4.

FIG. 8 illustrates a location displacement detection method and a location displacement detection device of Embodiment 4.

In the location displacement detection method and the location displacement detection device of Embodiment 4, the set of electrode pads 2 further includes a center pad 25. As illustrated in FIG. 8, the center pad 25 is located at the center portion of the first spacing between the first pad 21 and the second pad 22 in the X direction and at the center portion of the second spacing between the third pad 23 and the fourth pad 24.

Detection pads 41A are respectively electrically connected to the scale pad segments 3 via electrical resistors 42. The center pad 25 is connected to a detection pad 41B.

Each of the first pad 21 through the fourth pad 24 includes the scale pad segments 3. In the example of FIG. 8, each of the first pad 21 through the fourth pad 24 includes five scale pad segments 31 through 35. Thus, the location displacement may be determined according to five level gradations between the set of electrode pads 2 and the electrode 5.

The electrode 5 of a device not illustrated is connected to the set of electrode pads 2, and the conduction state between the scale pad segments 3 of each of the first pad 21 through the fourth pad 24 and the center pad 25 is thus detected. A resistance value with the center pad 25 (combined resistance) varies depending on up to what scale pad segment of the scale pad segments 31 through 35 is short-circuited.

For example, if the resistance value of each electrical resistor 42 is 15 kΩ, the resistance value between each of the scale pad segments 3 in the first pad 21 and the center pad 25 is 15 kΩ for a first scale pad segment 31, 7.5 kΩ for a second scale pad segment 32, 5 kΩ for a third scale pad segment 33, 3.75 kΩ for a fourth scale pad segment 34, and 3 kΩ for a fifth scale pad segment 35. The location displacement is individually detected in the first pad 21 through the fourth pad 24, based on the measured resistance values. The presence/absence of the location displacement of the electrode 5 relative to the set of electrode pads 2 is accurately detected.

A simple structure to measure the resistance of the electrical resistors 42 electrically connected to the scale pad segments 3 makes determination as to whether the location displacement of the electrode 5 is present relative to the set of electrode pads 2. A location displacement, if caused, is reliably detected.

In the layout pattern of the set of electrode pads 2 of Embodiment 4, the location displacement detection unit 1 may detect the presence/absence of the location detection in the rotation direction by using multiple sets of electrode pads 2 and the electrodes 5 of the number corresponding to the number of the sets of the electrode pads 2. As described with reference to Embodiment 1, the location displacement detection unit 1 may easily determine whether the location displacement has occurred in the rotation direction by comparing resistances measured on combinations of the electrode pads and the electrodes 5.

Embodiment 5

FIG. 9A through FIG. 11B illustrate location displacement detection methods and location displacement detection devices of Embodiment 5.

In the location displacement detection methods and the location displacement detection devices of Embodiment 5, the layout pattern of the electrode pads 2 has a higher degree of resolution in the determination of the location displacement.

Figure 9A:
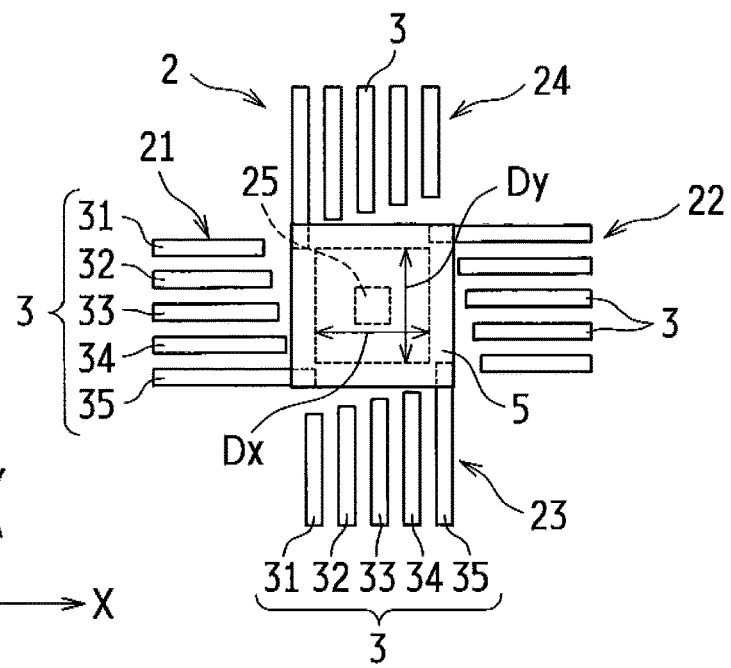
FIGS. 9A through 9C illustrate a location displacement detection method and a location displacement detection device of Embodiment 5.

In the example of FIG. 9A, the set of electrode pads 2 includes a center pad 25, and each of the first pad 21 and the second pad 22 is divided into the multiple scale pad segments 3 (31 through 35) that are arranged in the Y direction with an interval from each other. The ends of the scale pad segments 31 through 35 in the X direction on the side of the first spacing Dx are successively shifted apart from the first spacing Dx.

Similarly, each of the third pad 23 and the fourth pad 24 includes the multiple scale pad segments 3 (31 through 35) that are arranged in the X direction with an interval from each other. The ends of the scale pad segments 31 through 35 in the Y direction on the side of the second spacing Dy are successively shifted apart from the second spacing Dy.

In a way similar to Embodiment 4, all the scale pad segments 3 and the center pad 25 are electrically connected to detection pads 41A and 41B (not illustrated), respectively.

The amounts of shifts of the scale pad segments 3 of each of the first pad 21 and the second pad 22 in the X direction and the amounts of shift of the scale pad segments 3 of each of the third pad 23 and the fourth pad 24 in the Y direction are determined in view of the location displacement of the electrode 5 relative to the electrode pads 2 to be detected. The amount of shift in the X direction and the Y direction may be about 0.1 μm, for example.

In the example of FIG. 9A, the five scale pad segments 3 of the first pad 21 (31 through 35) are different from each other in length in the X direction. From among the five scale pad segments 3, the length difference between two adjacent pad segments of the first through fourth scale pad segments 3 is the same in a manner such that the ends thereof in the X direction on the side of the first spacing Dx are successively spaced apart further from the first spacing Dx in steps of equal length. The fifth scale pad segment 35 is sized to be sufficiently longer than each of the scale pad segments 31 through 34 such that the fifth scale pad segment 35 is short-circuited to the electrode 5 without fail in the normally mounted state. In this way, the electrical conduction is reliably obtained in the normally mounted state.

In the layout pattern of the set of electrode pads 2, the location displacement detection unit 1 may easily detect a location displacement of the electrode 5 relative to the electrode pads 2 in the X direction by referring to the conduction state between the first pad 21 through the second pad 22 and the electrode 5. Also, the location displacement detection unit 1 may easily detect the location displacement of the electrode 5 relative to the set of electrode pads 2 in the Y direction by referring co the conduction state between the third pad 23 and the fourth pad 24 and the electrode 5.

Figure 9B:
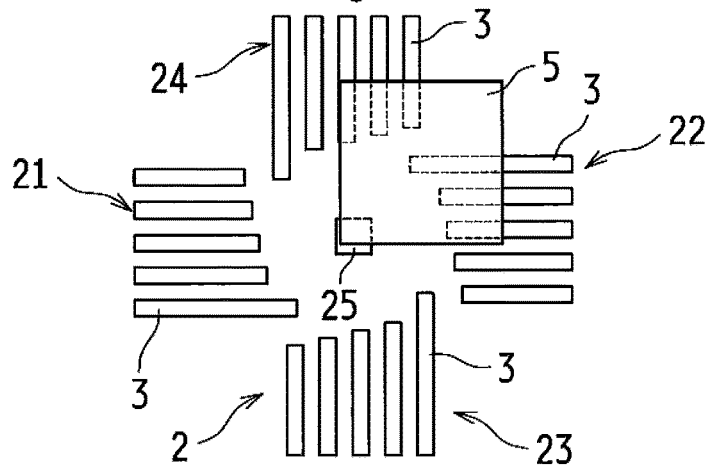
Figure 9C:
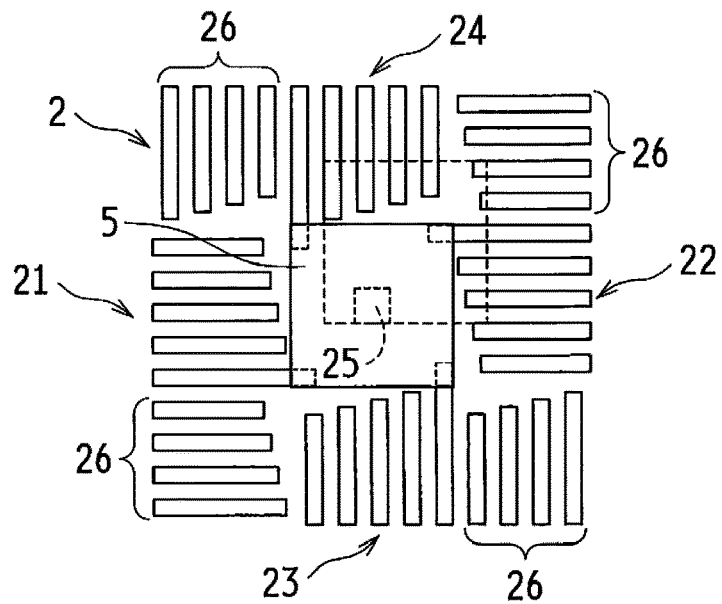

In the example of FIG. 9B, the first pad 21 and the third pad 23 are open-circuited to and not electrically connected to the electrode 5, and a large location displacement may be detected in the X direction and the Y direction. In the example of FIG. 9C, multiple backup pads 26 are further arranged outside the first pad 21 through the fourth pad 24. Like the scale pad segments 3, the backup pads 26 are arranged in the X direction or the Y direction in the same repeated pattern as the first pad 21 through the fourth pad 24. Even if a large location displacement occurs in the X direction and the Y direction, the location displacement of the electrode 5 relative to the electrode pads 2 is more accurately determined.

Figure 10:
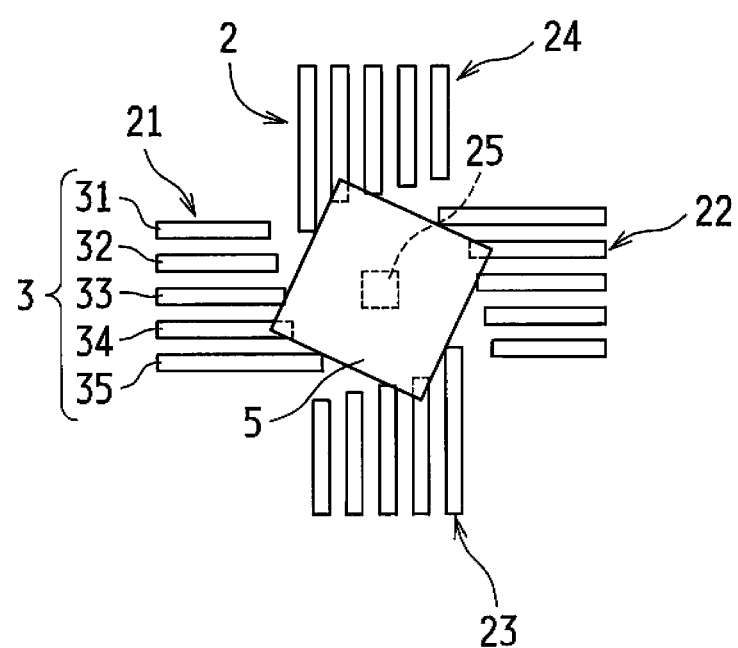
FIG. 10 illustrates another example of the location displacement detection method and the location displacement detection device of Embodiment 5.

In the example of FIG. 10, any of the scale pad segments 31 through the scale pad segment 35 of each of the first pad 21 through the fourth pad 24 is short-circuited to and thus electrically conductive to the electrode 5. The scale pad segments 3 in the first pad 21 through the fourth pad 24 that are short-circuited to the electrode 5 are point-symmetrical about the center pad 25. In this way, the location displacement detection unit 1 determines that the electrode 5 is not displaced from the electrode pads 2 in the X direction and the Y direction but determines that the electrode 5 has a location displacement in the rotation direction only.

Figure 11A:
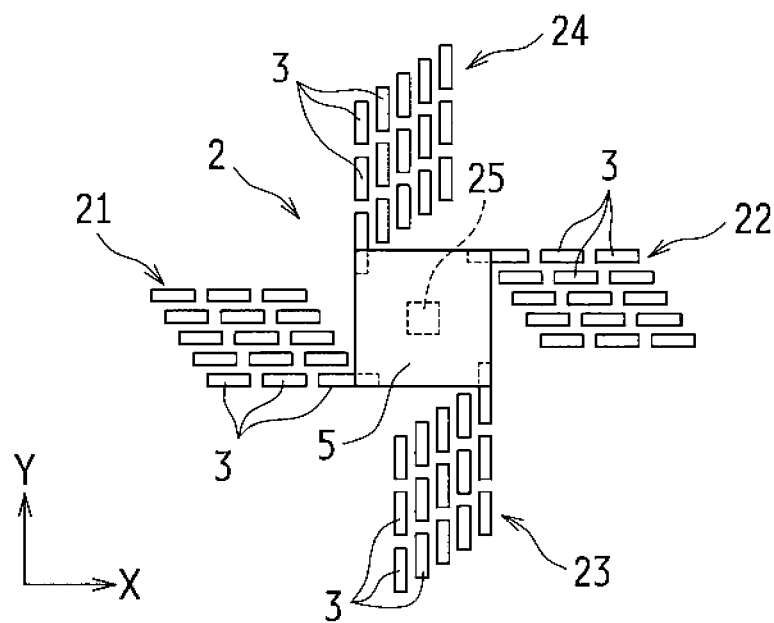
FIGS. 11A and 11B illustrate another example of the location displacement detection method and the location displacement detection device of Embodiment 5.
Figure 11B:
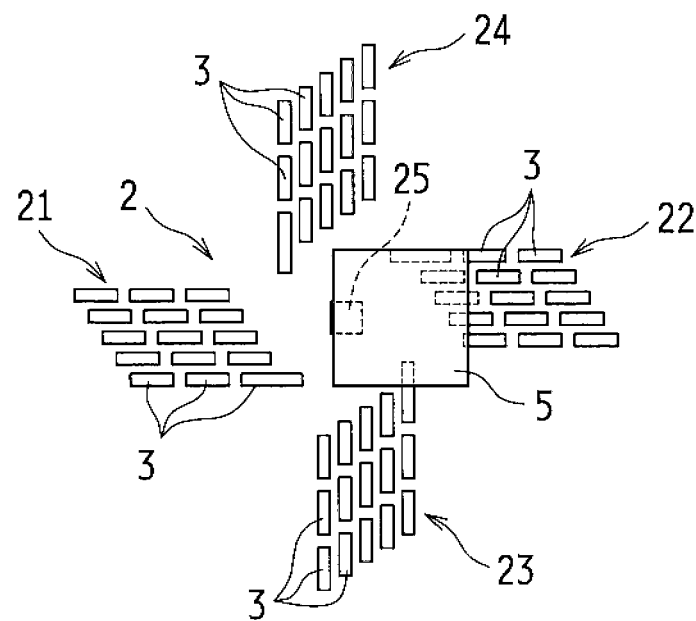

Referring to FIGS. 11A and 11B, each pad 2 may be further finely divided into the scale pad segments 3. In comparison with FIG. 9A, each of the scale pad 3 in each of the first pad 21 through the fourth pad 24 is divided in the longitudinal direction thereof. In each of the first pad 21 through the fourth pad 24, each of the scale pad 3 includes multiple sub-segments in the X direction and the Y direction. Referring to FIG. 11B, the number of the scale pad segments 3 is thus increased in the X direction and the Y direction. A larger location displacement may thus be easily detected.

Embodiment 6

Figure 12A:
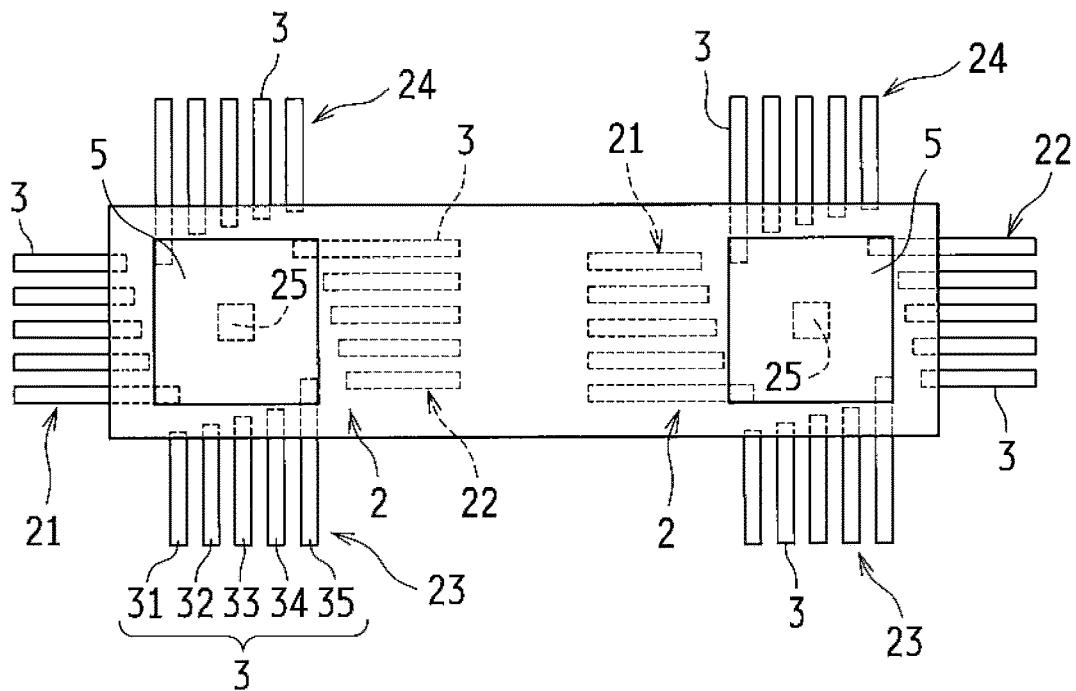
FIGS. 12A and 12B illustrate a location displacement detection method and a location displacement detection device of Embodiment 6.
Figure 12B:
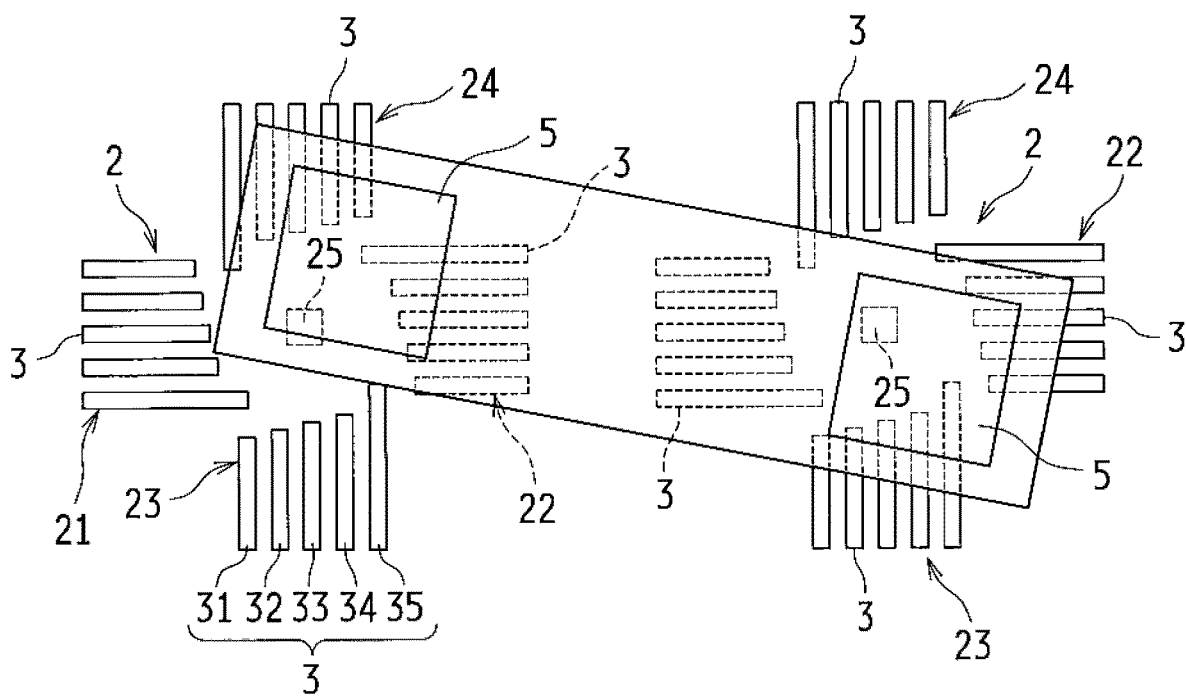

FIGS. 12A and 12B illustrate a location displacement detection method and a location displacement detection device of Embodiment 6.

In the location displacement detection method and the location displacement detection device of Embodiment 6, the location displacement detection unit 1 may determine whether the location displacement has occurred in the rotation direction by referring to the layout pattern of multiple sets of electrode pads 2.

In the example of FIG. 12A, two sets of electrode pads 2 are included. Each set of electrode pads 2 is identical in configuration to the set of electrode pads 2 of Embodiment 5 (FIGS. 9A through 9C). When the first pad 21 through the fourth pad 24 are equally short-circuited to the electrode 5 in each set of electrode pads 2, the location displacement detection unit 1 determines that no location displacement has occurred.

In contrast, as illustrated in FIG. 12B in the electrode pads 2 on the left side, the first pad 21 and the third pad 23 are open-circuited to the electrode 5, and the second pad 22 and the fourth pad 24 are short-circuited to the electrode 5. In the electrode pads 2 on the right side, the first pad 21 through the third pad 23 are short-circuited to the electrode 5, and only a single scale pad 3 of the fourth pad 24 is short-circuited to the electrode 5. If the short and open circuit configuration of one set of electrode pads 2 is different from the short and open circuit configuration of the other set of electrode pads 2, the location displacement detection unit 1 determines that a location displacement has occurred in the rotation direction.

If the short and open circuit configuration of one set of electrode pads 2 is identical to the short and open circuit configuration of the other set of electrode pads 2, the location displacement detection unit 1 determines that a location displacement has occurred in the X direction or the Y direction. In this case, the location displacement detection unit 1 determines that no location displacement has occurred in the rotation direction.

In this way, the location displacement detection unit 1 may easily detect the presence/absence of the location displacement of the electrode 5 in the rotation direction with respect to the set of electrode pads 2 by detecting the short circuit or the open circuit between the multiple sets of electrode pads 2 and the electrodes 5 of the number equal to the number of sets of electrode pads 2.

The location displacement detection unit 1 may also detect the location displacement in the X direction, the Y direction, and the rotation direction by referring to the conduction condition between the fifth scale pad 35 in each of the two sets of electrode pads 2 and the electrode 5. More specifically, the presence/absence of electrical conduction is verified by referring to the resistance value between the fifth scale pad 35 and the center pad 25. If the electrical conduction is verified, all the fifth scale pads 35 are determined to be short-circuited, and the electrode 5 is determined to be in the normally mounted state as illustrated in FIG. 12A.

Concerning the two sets of electrode pads 2, if the first pad 21 on one set is identical to the first pad 21 on the other set in terms of the resistance value between the fifth scale pad 35 and the center pad 25, and each of the second pad 22 through the fourth pad 24 on the one set s identical to the counterpart on the other set in terms of the resistance value between the fifth scale pad 35 and the center pad 25, the location displacement detection unit 1 determines that the location displacement has occurred in the X direction and/or the Y direction. If the resistance values are different, the location displacement detection unit 1 determines that a location displacement has occurred in the rotation direction as illustrated in FIG. 12B.

Embodiment 7

Figure 13:
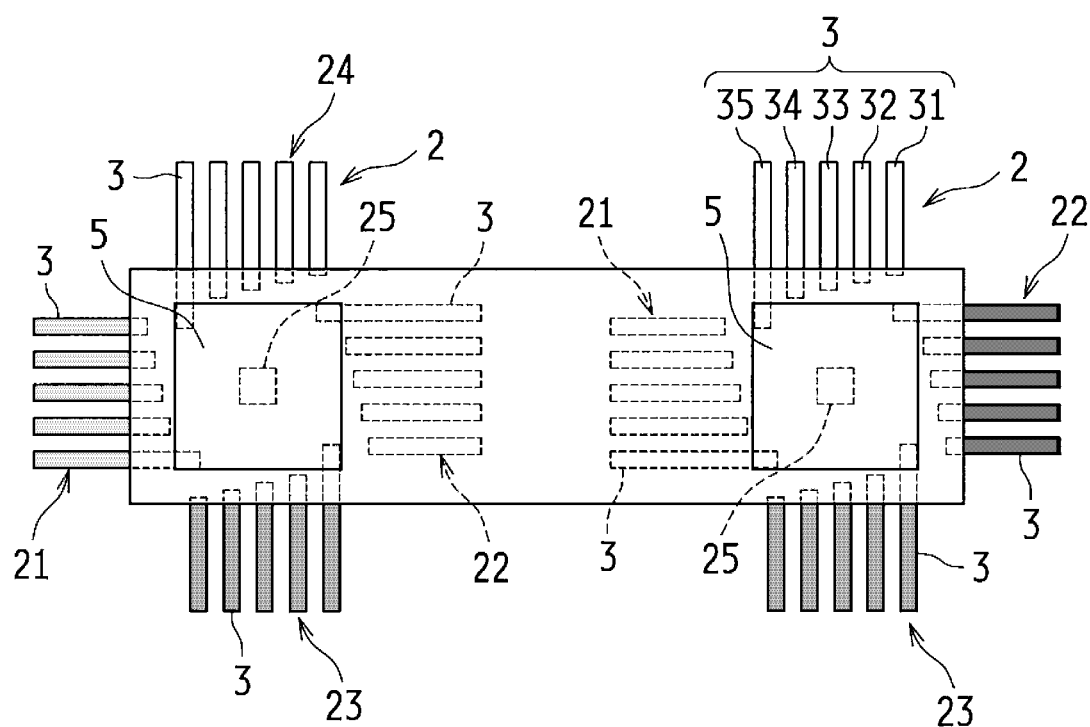
FIG. 13 illustrates a location displacement detection method and a location displacement detection device of Embodiment 7.

FIG. 13 illustrates a location displacement detection method and a location displacement detection device of Embodiment 7.

The location displacement detection methods and the location displacement detection devices described above are suitably used in a display device, such as a semiconductor module including multiple light-emitting devices arranged in a two-dimensional matrix on a large-scale integration (LSI) chip. The device is desirably a group of light-emitting devices (LEDs) arranged in a matrix. The semiconductor element is desirably a driving element (driver) that controls lighting of the light-emitting devices.

The location displacement detection methods and the location displacement detection devices described above may suitably be used in a display device, such as a semiconductor module including a single light-emitting device mounted on an LSI chip.

In the location displacement detection method and the location displacement detection device of FIG. 13, the layout pattern of the multiple sets of the electrode pads 2 is common to the layout pattern of Embodiments 4 to 6. The location displacement detection unit 1 is mounted on the driving element. The multiple sets of electrode pads 2 are respectively connected to the electrodes 5. The scale pad segments 3 (31 through 35) are connected to the detection pads 41 via electrical resistors (42).

In the two sets of electrode pads 2, for example, the electrode pads 2 on one set are connected to anode electrodes of a dummy element around a light-emitting device forming a display device, and the electrode pads 2 on the other set are connected to cathode electrodes of the dummy element. A voltage is applied between the electrode pad 2 on the one set and the electrode pad 2 on the other set.

If the electrode 5 of the light-emitting device is electrically connected to the electrode pads 2 of the driving element in the normally mounted position as illustrated in FIG. 13, the dummy element is lighting in a light-emission state. In this way, the location displacement detection unit 1 determines that no location displacement has occurred in the electrodes 5 relative to the electrode pads 2 and thus determines that electrical conduction has been established.

If at least one of the first pad 21 through the fourth pad 24 is non-conductive to the electrode 5, the location displacement detection unit 1 determines that the electrode 5 of the light-emitting device has a location displacement relative to the electrode pads 2 of the driving element, and determines that the electrode 5 is in a non-conductive state (with lighting of the dummy element being stopped, that is, no lighting). In the two sets of the electrode pads 2, the location displacement detection unit 1 determines whether the location displacement is present in the X direction or the Y direction by verifying the lighting of the dummy element on each combination of pad groups in corresponding sets, for example, on the combination of the first pad 21 in one set and the first pad 21 in the other set, on the combination of the second pad 22 in the one set and the second pad 22 in the other set, and so on. If a location displacement occurs, display performance could drop in the form of color unevenness or color shift. The presence/absence of a location displacement is thus detected, and the conduction state is verified. According, a display device with a higher light emission efficiency and higher reliability may be realized.

If the device is a light-emitting device, and the semiconductor element is a driving element that drives the light-emitting device, the location displacement detection device is not limited to the one built in the display device illustrated in the example, but is installed external to the display device. The semiconductor module on which light-emitting devices are arranged in matrix has been described. However, the device is not limited to the light-emitting device and arrangement of the light-emitting devices is not limited to a matrix formation.

In any of the embodiments described above, the presence/absence of a location displacement of the electrical connection portion of the device to be electrically connected, relative to the electrical connection portion of the semiconductor element is easily verified, and the conduction state therebetween is verified. A highly reliable display device may be realized.

The location displacement detection methods, the location displacement detection devices, and the display devices of the embodiments have been described for exemplary purposes and do not provide the basis for limited interpretations. The scope of the disclosure is not described by the embodiments alone, but is based on the claims. The scope of the disclosure includes all changes to the embodiments falling within the scope defined by the claims. For example, the multiple pads included in the set of electrode pads 2 are not limited to the first pad 21 through the fourth pad 24, and may include more pads. The layout pattern of the set of electrode pads 2 is not limited to those described in the embodiments, and may include any layout pattern.

The embodiments above describe the specific configuration in which the location displacement detection unit in each of the location displacement detection methods and the location displacement detection devices determines that a location displacement of the electrical connection portion of the device has not occurred relative to the electrical connection portion of the semiconductor element if the electrical conduction is established between the electrical connection portion of the semiconductor element and the electrical connection portion of the device, and on the other hand, the location displacement detection unit 1 determines that a location displacement has occurred if the electrical conduction is not established between the electrical connection portion of the semiconductor element and the electrical connection portion of the device. The disclosure is not limited to this configuration. Conversely, the location displacement detection unit may determine that a location displacement has not occurred if the electrical conduction is not established between the electrical connection portion of the semiconductor element and the electrical connection portion of the device, and may determine that a location displacement has occurred if the electrical conduction is established between the semiconductor element and the device.

As an example of the latter case, in addition to the outside pads including the first pad 21 through the fourth pad 24, single pad (center pad) is located at the center (right under the electrical connection portion of the device). In the non-conductive state, the location displacement detection unit may determine whether the device is in a "location-displacement free state" or whether the device is in an "electrically open-circuited state". If the operation of the device is verified using two sets of electrode pads 2 (lighting is verified if the device is a light-emitting element), the location displacement detection unit determines that the device is mounted in a manner free from any location displacement and that the electrical connection is established.

It is sufficient if the location displacement detection methods and the location displacement detection devices of the embodiments of the disclosure detect and determine the location displacement of the electrical connection portion of the device relative to the electrical connection portion of the semiconductor element, based on the conduction state (the presence/absence of the electrical connection) between the electrical connection portion of the semiconductor element and the electrical connection portion of the device.

Whether the device (light-emitting device: LED) has been mounted is determined by the location displacement detection unit determining that the device is not displaced relative to the semiconductor element when the electrical connection portion of the semiconductor element is conductive to the electrical connection portion of the device. When the location displacement detection unit determines that the device is displaced relative to the semiconductor element because the electrical connection portion of the semiconductor element is non-conductive to the electrical connection portion of the device, whether the device has been mounted may be detected by using the center pad and the location displacement may be detected by using the external pads.

Whether the device is mounted or not is verified by referring to the electrical connection between the center pad and the device.

If the device is an LED, an anode electrode and a cathode electrode are employed. The operation of the device may be verified by measuring a forward voltage (Vf) between. the anode and cathode electrodes, or by causing the LED to emit light. More specifically, the statuses are verified as described below.

No electrical connection: Connection status between the anode electrode and the cathode electrode is in an open circuit state, and the external pads are in an open circuit state.

Electrically connected and location displaced: Light is emitted between the anode electrode and the cathode electrode, and characteristics such as Vf may be obtained. The external pads and the center pad are short-circuited, and the external pads serving as the anode and cathode electrodes are short-circuited (conductive) (in the anode to cathode direction).

Electrically connected and location not displaced: Light is emitted between the anode electrode and the cathode electrode, and characteristics such as Vf may be obtained. The external pads are in an open circuit state.

When the single pad is used for verification, the center pad may be divided into multiple segments (four segments, for example). The center pad segments may be connected to large-sized extension pads for verification. Such a configuration permits easy verification.

The present disclosure contains subject matter related to that disclosed in Japanese Priority Patent Application JP 2017-250190 filed in the Japan Patent Office on Dec. 26, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A location displacement detection device that detects a location displacement of an electrical connection portion of a device relative to an electrical connection portion of a semiconductor element electrically connectable to the electrical connection portion of the device, the location displacement detection device comprising a location displacement detection unit that detects the location displacement of the electrical connection portion of the device relative to the electrical connection portion of the semiconductor element, based on a conduction state between the electrical connection portion of the semiconductor element and the electrical connection portion of the device, the electrical connection portion of the semiconductor element comprises first and second connection portions arranged in a first direction with a first spacing apart from each other, and third and fourth connection portions arranged in a second direction perpendicular to the first direction with a second spacing apart from each other.

2. The location displacement detection device according to claim 1, wherein
the location displacement detection unit determines that the location displacement has not occurred when the electrical connection portion of the semiconductor element is electrically conductive to the electrical connection portion of the device, and determines that the location displacement has occurred when the electrical connection portion of the semiconductor element is electrically non-conductive to the electrical connection portion of the device.

3. The location displacement detection device according to claim 1, wherein
the electrical connection portion of the semiconductor element is segmented into a plurality of electrical connection sub-portions.

4. The location displacement detection device according to claim 3, wherein
the location displacement detection unit is electrically connected to the electrical connection sub-portions of the semiconductor element respectively via electrical resistors.

5. The location displacement detection device according to claim 1, wherein
the electrical connection portion of the semiconductor element has a size corresponding to a permissible location displacement range with the electrical connection portion of the device in a conductive state with the semiconductor element.

6. The location displacement detection device according to claim 1, wherein
the first and second connection portions and the third and fourth connection portions are mounted with the first spacing and the second spacing overlapping each other.

7. The location displacement detection device according to claim 1, wherein
the electrical connection portion of the semiconductor element further comprises a center connection portion located in a center portion of the first spacing and the second spacing,
each of the first connection portion and the second connection portion includes a plurality of scale connection portion segments, each of the scale connection portion segments being arranged in the first direction, and
each of the third connection portion and the fourth connection portion includes a plurality of scale connection portion segments, each of the scale connection portion segments being arranged in the second direction.

8. The location displacement detection device according to claim 1, wherein
the electrical connection portion of the semiconductor element further comprises a center connection portion located in a center portion of the first spacing and the second spacing,
each of the first connection portion and the second connection portion includes a plurality of scale connection portion segments, each of the scale connection portion segments being arranged in the second direction, and ends of the scale connection portion segments facing the first spacing successively shifted farther from the first spacing, and
each of the third connection portion and the fourth connection portion includes a plurality of scale connection portion segments, each of the scale connection portion segments being arranged in the first direction, and ends of the scale connection portion segments facing the second spacing successively shifted farther from the second spacing.

9. The location displacement detection device according to claim 1, wherein
the location displacement detection unit detects a location displacement in a rotation direction about an axis along a third direction perpendicular to the first direction and the second direction, using the first connection portion through the fourth connection portion of the semiconductor element and the electrical connection portion of the device.

10. The location displacement detection device according to claim 9, wherein
the electrical connection portion of the semiconductor element comprises a plurality of connection portion sets, each including a set of the first connection portion through the fourth connection portion, and
the electrical connection portion of the device is arranged for each of the connection portion sets.

* * * * *